(12) United States Patent
Oshima (10) Patent No.: US 6,445,670 B1
(45) Date of Patent: Sep. 3, 2002

(54) LASER POWER CONTROL DEVICE, OPTICAL HEAD AND OPTICAL RECORDING AND/OR REPRODUCING APPARATUS

(75) Inventor: Yoichi Oshima, Chiba (JP)

(73) Assignee: Sony Corporation, Tokyo (JP)

( * ) Notice: Subject to any disclaimer, the term of this patent is extended or adjusted under 35 U.S.C. 154(b) by 75 days.

(21) Appl. No.: 09/611,480

(22) Filed: Jul. 7, 2000

(30) Foreign Application Priority Data

Jul. 9, 1999 (JP) ............................................. 11-196531
Mar. 2, 2000 (JP) ........................................ 2000-061876

(51) Int. Cl.[7] ................................................ G11B 7/00

(52) U.S. Cl. ................ 369/116; 372/29.01; 372/29.021

(58) Field of Search ................................. 369/116, 121, 369/44.12, 59.11, 59.12, 47.5, 53.26; 250/205; 372/29.01–32, 24, 26, 25; 347/236–239

(56) References Cited

U.S. PATENT DOCUMENTS

| | | | |
|---|---|---|---|
| 4,359,773 A | * 11/1982 | Swartz et al. | .................. 372/26 |
| 4,788,560 A | * 11/1988 | Miura | ......................... 369/116 |
| 6,191,804 B1 | * 2/2001 | Kitagawa et al. | ........... 347/237 |
| 6,358,764 B1 | * 3/2002 | Nemoto | ........................ 438/22 |

* cited by examiner

*Primary Examiner*—Thang V. Tran
(74) *Attorney, Agent, or Firm*—Frommer Lawrence & Haug LLP; William S. Frommer; Darren M. Simon (57) ABSTRACT

A laser power control device, optical head and optical recording and/or reproducing apparatus to set and control the output power of laser light radiated from a plurality of laser sources. The laser power control device is provided with plural variable resistors associated with the plural laser sources, a photodetector unit associated with the plural laser sources, and a laser output stabilizing unit for controlling the laser light output power at a constant predetermined level. The resistance values of the variable resistors are set so that the output power of the laser light radiated from the laser sources is at the predetermined level.

23 Claims, 7 Drawing Sheets

FIG.8

LASER POWER CONTROL DEVICE, OPTICAL HEAD AND OPTICAL RECORDING AND/OR REPRODUCING APPARATUS

BACKGROUND OF THE INVENTION

1. Field of the Invention

The present invention relates to a laser power control device for controlling the output laser light radiating from multiple laser sources, and to an optical head employing this laser power control device for use in an optical recording and/or reproducing apparatus.

2. Description of the Related Art

Currently, optical recording and/or reproducing apparatus are generally equipped with a laser light source which is radiated onto an optical recording medium for information recording and/or reproduction. For these apparatus, it is necessary to pre-set the output power of the radiated laser light to a predetermined level. Laser power control devices are normally built into these apparatus to monitor and maintain the output power at the predetermined level.

Currently, a wide variety of optical recording mediums are commercially available. Many of these recording mediums use different recording densities. These different densities often necessitate the use of different wavelengths of laser light.

Optical recording and/or reproduction apparatus have been developed which can use several different laser wavelengths. This allows these apparatus to operate using several different optical recording mediums. These multiple medium apparatus currently employ independent laser power control devices to control the respective laser sources used by each medium. However, this use of separate laser power control devices makes it difficult to reduce the size of the apparatus. Moreover, the production cost of such multi-medium apparatus tends to be prohibitive.

Recent proposals have been made to fabricate multiple laser sources on a single monolithic chip and to arrange the sources close to one another. However, if the laser sources are arranged in close proximity to one another, it is difficult to provide independent laser power control devices for each laser source.

OBJECTS OF THE INVENTION

In view of the above problem, an object of the present invention is to control a plurality of laser sources using a single laser power control device.

Another object of the present invention is to provide a laser power control device capable of controlling the outputs of the respective laser light beams radiated from the plural laser sources.

A further object of the present invention is to provide an optical recording and/or reproducing apparatus using such a laser power control device.

Still other objects and advantages of the invention will in part be obvious and will in part be apparent from the specification and the drawings.

SUMMARY OF THE INVENTION

For accomplishing the above object, the present invention provides a laser power control device for controlling the output of respective laser light beams radiated from a plurality of laser sources, including a plurality of variable resistors associated with the laser sources, a sole photodetector associated with the laser light sources, and a laser output stabilizer for controlling the output of the laser light so that the output of the laser light radiated from the laser sources will be constant. The resistance values of the variable resistors are changed to set the output of the laser light radiated from the laser sources associated with the variable resistors. The intensity of the laser light radiated from the laser light sources is detected by the photodetector, and the output of the laser light is controlled by the laser output stabilizer, based on the detected intensity, so that the laser light beams output by the laser light sources will be constant.

The present invention also provides an optical head including a plurality of laser light sources, optical elements for radiating laser light beams radiated from the laser sources towards a recording medium, a light receiver for receiving the return light from the recording medium and a laser power controller for controlling the output of the laser light radiated from the laser sources. The laser power controller is of the aforementioned type.

With the laser power control device and the optical head, according to the present invention, the laser light power output from plural laser sources can be respectively controlled by a single circuit.

BRIEF DESCRIPTION OF THE DRAWINGS

For a more complete understanding of the invention, reference is made to the following description and accompanying drawings, in which.

DETAILED DESCRIPTION OF PREFERRED EMBODIMENTS

The specific structures of the laser power control device, optical head and the optical recording and/or reproducing apparatus employing this optical head are explained hereinafter by referring to the Figures.

Figure 1:
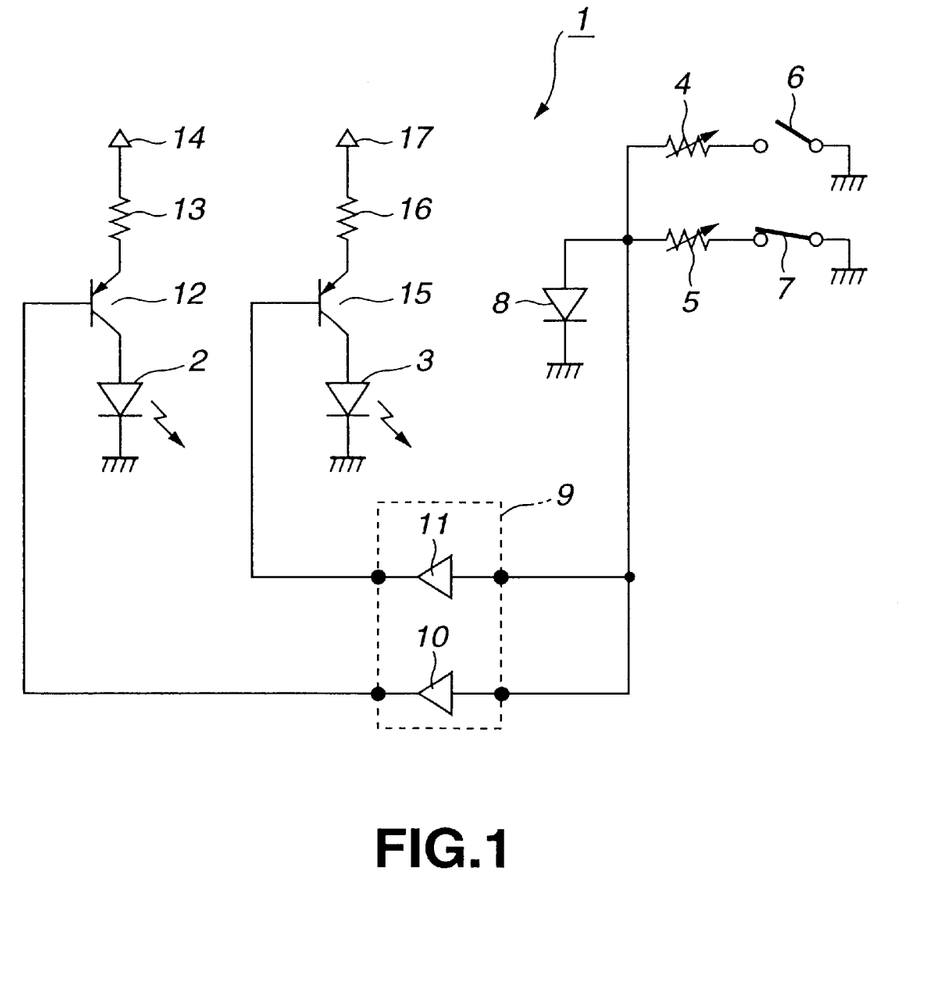
FIG. 1 is a circuit diagram showing an embodiment of a laser power control device according to the present invention.

A first embodiment of a laser power control device according to the present invention is shown in FIG. 1. This laser power control device 1 controls the laser light outputs radiated from a first laser diode 2 and a second laser diode 3. The first laser diode 2 and the second laser diode 3 are controlled to prevent simultaneous operation.

This laser power control device 1 includes a first variable resistor 4 associated with the first laser diode 2, a second variable resistor 5 associated with the second laser diode 3, a first switch 6 connected to the first variable resistor 4, a second switch 7 connected to the second variable resistor 5, a power monitoring photodiode 8 associated with the first and second laser diodes 2, 3, and an automatic light volume controlling amplifier 9 for controlling the laser light output so that the outputs of the laser light beams radiated from the first and second laser diodes 2, 3 will be constant.

The automatic light volume controlling amplifier 9 includes a first amplifier 10 for controlling the laser light radiated from the first laser diode 2 at a constant level and a second amplifier 11 for controlling the laser light radiated from the second laser diode 3 at a constant level.

In this laser power control device 1, the first variable resistor 4 has one end connected to the first switch 6, so that this end is grounded and emancipated when the first switch 6 is turned on and off, respectively. The first variable resistor 4 has its other end connected to input terminals of the first and second amplifiers 10, 11. Similarly, the second variable resistor 5 has one end connected to the second switch 7, so that this end is grounded and emancipated when the second switch 7 is turned on and off, respectively. The second variable resistor 5 has its other end connected to input terminals of the first and second amplifiers 10, 11. The terminals of the first and second variable resistors 4, 5, which are connected to the input terminals of the first and second amplifiers 10, 11 are also connected to the cathode of photodiode 8.

The first laser diode 2 has its cathode grounded and its anode connected to the collector of a PNP transistor 12. The emitter of the PNP transistor 12 is connected via a resistor 13 to a power source 14. The emitter is fed with the voltage from the power source 14 through resistor 13 when the first laser diode 2 is on. The base of the PNP transistor 12 is connected to the output terminal of the first amplifier 10. The laser light output is controlled by the magnitude of the current flowing through the first laser diode 2.

Similarly, the second laser diode 3 has its cathode grounded and its anode connected to the collector of the PNP transistor 15. The emitter of this PNP transistor 15 is connected through a resistor 16 to a power source 17. The emitter is fed with a voltage from the power source 17 through the resistor 16 when the second laser diode 3 is on. The base of the PNP transistor 15 is connected to the output terminal of the second amplifier 11 so that the current magnitude flowing through the second laser diode 3 is controlled by the second amplifier 11, thereby controlling the laser light output.

To set the output power of the laser light from the first laser diode 2 to a predetermined value, the first switch 6 is turned on thereby grounding one end of the first variable resistor 4; the second switch 7 is turned off thereby floating one end of the second variable resistor 5. Thus, when setting the power level for the first laser diode 2, switches 6, 7 are configured so that only the first variable resistor 4 is used. The resistance of the variable resistor 5 is then varied to set the output of the laser light radiated from the first laser diode 2 to a predetermined level. In this state, the intensity of the laser light radiated from the first laser diode 2 is detected by the photodiode 8. The photodiode 8 generates a current proportional to the intensity of the detected light. This generated current is converted by the first amplifier 10 to a voltage potential which is applied to the base of PNP transistor 12. The PNP transistor 12 controls the drive current flowing to the laser diode in inverse proportion to the applied base voltage. For example, if photodiode 8 detects an increase in laser intensity, more current is produced which the amplifier uses to increase the base voltage which results in decreased laser drive current, thereby decreasing the laser intensity. In this manner, the photodiode 8 effectively regulates the drive current to keep the output laser intensity constant.

To set the output power of the laser light from second laser diode 3 to a predetermined value, the second switch 7 is turned on thereby grounding one end of the second variable resistor 5; the first switch 6 is turned off thereby floating one end of the first variable resistor 4. Thus, when setting the power level for the second laser diode 3, switches 6, 7 are configured so that only the second variable resistor 5 is used. The resistance of the variable resistor 4 is then varied to set the output of the laser light radiated from the second laser diode 3 to a predetermined level. In this state, the intensity of the laser light radiated from the second laser diode 3 is detected by the photodiode 8. The photodiode 8 generates a current proportional to the intensity of the detected light. This generated current is converted by the second amplifier 11 to a voltage potential which is applied to the base of PNP transistor 15. The PNP transistor 15 controls the drive current flowing to the laser diode in inverse proportion to the applied base voltage. For example, if photodiode 8 detects an increase in laser intensity, more current is produced which the amplifier uses to increase the base voltage which results in decreased laser drive current, thereby decreasing the laser intensity. In this manner, the photodiode 8 effectively regulates the drive current to keep the output laser intensity constant.

With the above-described laser power control device 1, it is possible to set and control the power of the laser light output by the two laser diodes 2, 3 to respective preset power levels with a single circuit. By using this device, it is possible to reduce the size of products as compared to providing respective independent laser power control devices for each laser diode. This also reduces the production cost by reducing the number of component parts.

If the first and second laser diodes 2, 3 are fabricated into a monolithic unit, the first and second laser diodes 2, 3 will be extremely close together. This close proximity makes it extremely difficult to provide individual light intensity detection means for each of the laser diodes. In this laser power control device 1, detection of the light intensity output by the first laser diode 2 and by the second laser diode 3 is handled by a single power-monitoring photodiode 8. This use of a single detecting element makes it possible to fabricate the first and second laser diodes 2, 3 monolithically into a single chip.

In the above-described laser power control device 1 since only one of the variable resistors 4, 5, is used at a time, adjustments to either laser diode's power settings can be performed independently.

Figure 2:
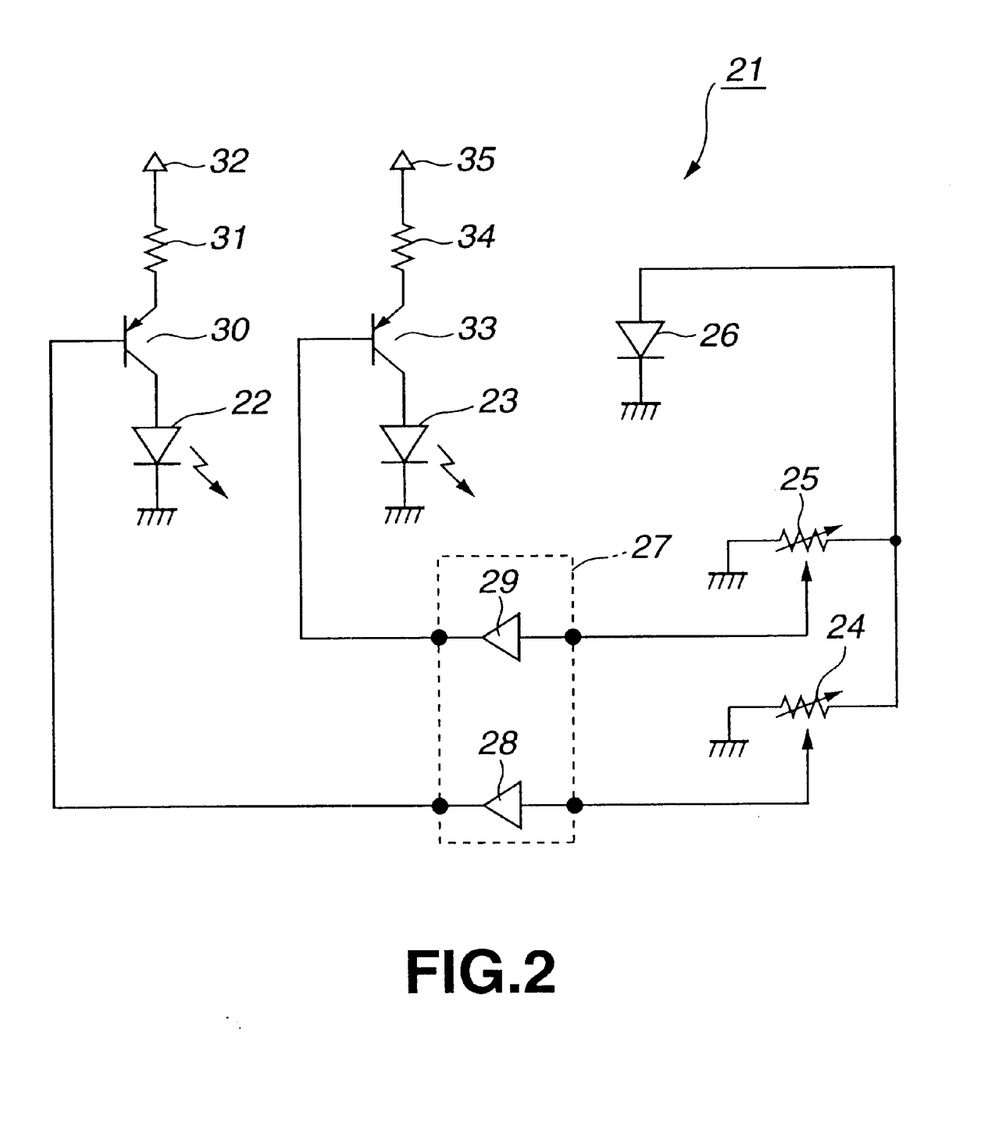
FIG. 2 is a circuit diagram showing another embodiment of a laser power control device according to the present invention.

A second embodiment of the laser power control device according to the present invention is hereinafter explained with reference to FIG. 2. This laser power control device 21 controls the laser light radiated from the first laser diode 22 as a first source and the laser light radiated from the second laser diode 23 as a second source. The first laser diode 22 and the second laser diode 23 are controlled to prevent simultaneous operation.

This laser power control device 21 includes a first variable resistor 24 associated with the first laser diode 22, a second variable resistor 25 associated with the second laser diode 23, a power monitoring photodiode 26 associated with the first and second laser diodes 22, 23, and an automatic light volume controlling amplifier 27 for controlling the output of the laser light so that the output of the laser light radiated from the first and second laser diodes 22, 23 will be constant. The first variable resistor 24 and the second variable resistor 25 are connected in parallel with the photodiode 26.

The automatic light volume controlling amplifier 27 includes a first amplifier 28 for keeping constant the peak intensity of the laser light radiated from the first laser diode 22, and a second amplifier 29 for keeping constant the peak intensity of the laser light radiated from the second laser diode 23.

In this laser power control device 21, the first variable resistor 24 has one end connected to the anode of the photodiode 26 and the other end connected to the input terminal of the first amplifier 28. Similarly, second variable resistor 25 has one end connected to the anode of the photodiode 46 and the other end connected to the input terminal of the second amplifier 29. The cathode of the photodiode 26 is grounded.

The first laser diode 22 has its cathode grounded and its anode connected to the collector of a PNP transistor 30. The emitter of the PNP transistor 30 is connected via a resistor 31 to a power source 32 and the base of the PNP transistor 30 is connected to the output terminal of the first amplifier 28. The emitter is fed with the voltage from the power source 32 through the resistor 31 when the first laser diode 22 is on. The laser light output is controlled by the magnitude of the current flowing through the first laser diode 22.

Similarly, the second laser diode 23 has its cathode grounded and its anode connected to the collector of a PNP transistor 33. The emitter of this PNP transistor 33 is connected through a resistor 34 to a power source 35. The emitter is fed with a voltage from the power source 35 through the resistor 34 when the second laser diode 23 is on. The base of the PNP transistor 33 is connected to the output terminal of the second amplifier 29 so that the magnitude of the current flowing through the second laser diode 23 is controlled by the second amplifier 29.

When setting and controlling the power level of the laser output by the first laser diode 22, the resistance of the first variable resistor 24 is changed to set the output to a predetermined level. In this state, the intensity of the laser light radiated from the first laser diode 22 is detected by the photodiode 26. The photodiode 26 generates a current proportional to the intensity of the detected light. This generated current is converted by the first amplifier 28 to a voltage potential which is applied to the base of PNP transistor 30. The PNP transistor 30 controls the drive current flowing to the laser diode in inverse proportion to the applied base voltage. For example, if photodiode 26 detects an increase in laser intensity, more current is produced which the amplifier uses to increase the base voltage which results in decreased laser drive current, thereby decreasing the laser intensity. In this manner, the photodiode 26 effectively regulates the drive current to keep the output laser intensity constant.

Likewise, when setting and controlling the power level of the laser light output by the second laser diode 23, the resistance of the variable resistor 25 is changed to set the output to a predetermined level. In this state, the intensity of the laser light radiated from the second laser diode 23 is detected by the photodiode 26. The photodiode 26 generates a current proportional to the intensity of the detected light. This generated current is converted by the second amplifier 29 to a voltage potential which is applied to the base of PNP transistor 33. The PNP transistor 33 controls the drive current flowing to the laser diode in inverse proportion to the applied base voltage. For example, if photodiode 26 detects an increase in laser intensity, more current is produced which the amplifier uses to increase the base voltage which results in decreased laser drive current, thereby decreasing the laser intensity. In this manner, the photodiode 26 effectively regulates the drive current to keep the output laser intensity constant.

In the above-described laser power control device 21, the laser power output by the two laser diodes 22, 23 can be independently controlled with a single circuit. This allows a system using this device to be reduced in size in comparison to an arrangement of providing respective independent laser power control devices for each laser diode. This also reduces the production cost by reducing the number of component parts.

If the first and second laser diodes 22, 23 are fabricated into a monolithic unit, the first and second laser diodes 22, 23 will be extremely close to each other. This makes it extremely difficult to provide individual light intensity detection means for each laser diode. In this laser power control device 21, detection of the light intensity output by the first laser diode 22 and the second laser diode 23 is handled by a single photodiode 46. This use of a single photodiodes makes it possible to fabricate the first and second laser diodes 22, 23 monolithically onto a single chip.

In the above-described laser power control device 21 since the first variable resistor 24 and the second variable resistor 25 are connected in parallel to each other, output control of the first and second laser diodes is carried out substantially independently.

Figure 3:
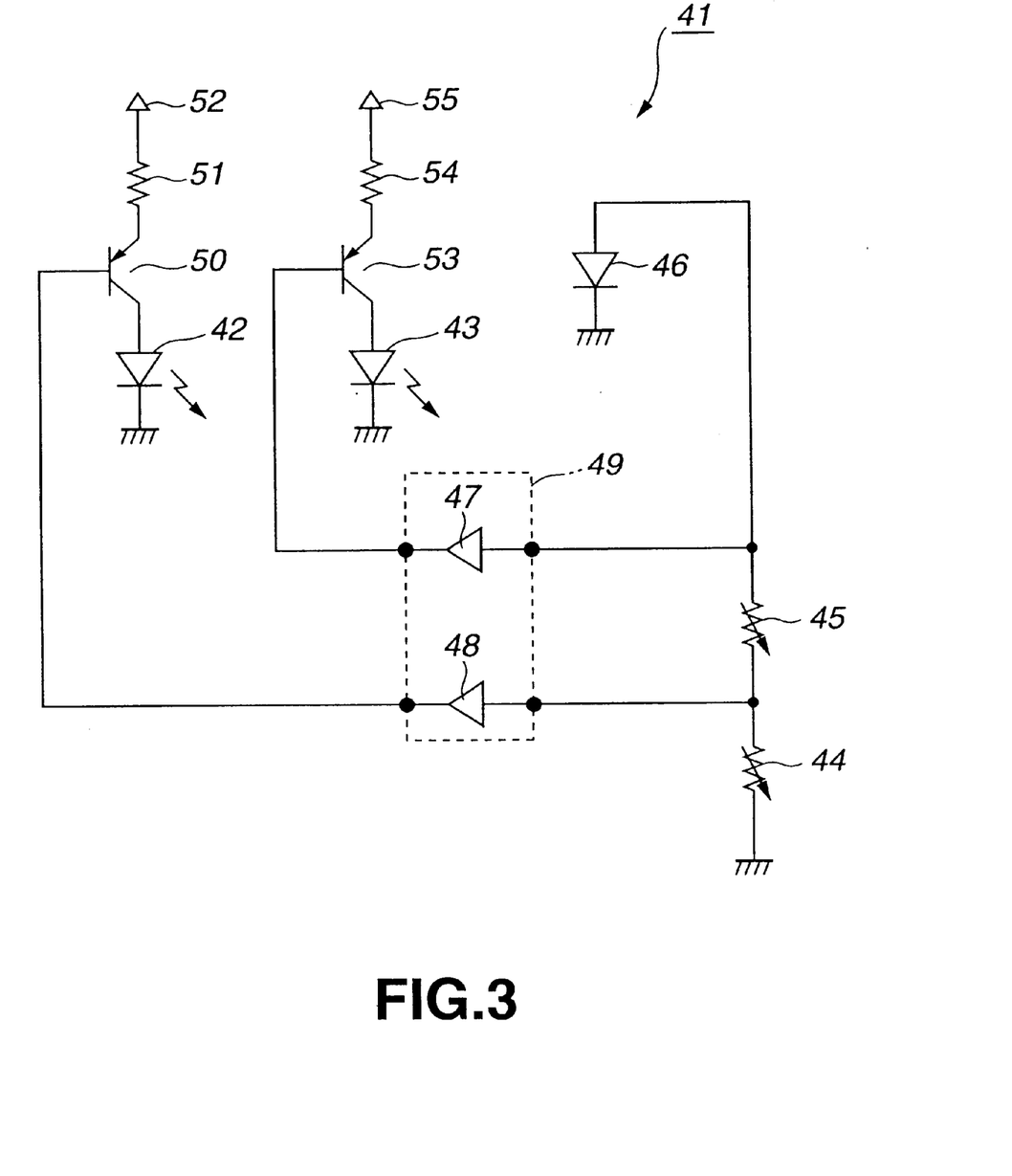
FIG. 3 is a circuit diagram showing still another embodiment of a laser power control device according to the present invention.

A third embodiment of the laser power control device according to the present invention is explained hereinafter with reference to FIG. 3. This laser power control device 41 controls the laser light radiated from a first laser diode 42 as a first source and the laser light radiated from a second laser diode 43 as a second source. The first laser diode 42 and the second laser diode 43 are controlled to prevent simultaneous operation.

This laser power control device 41 includes a first variable resistor 44 associated with the first laser diode 42, a second variable resistor 45 associated with the second laser diode 43, a power monitoring photodiode 46 associated with the first and second laser diodes 42, 43, and an automatic light volume controlling amplifier 47 for controlling the output of the laser light so that the output radiated from the first and second laser diodes 42, 43 will be constant. The first variable resistor 44 and the second variable resistor 45 are connected in series with the photodiode 46.

The automatic light volume controlling amplifier 47 is made up of a first amplifier 48 for keeping constant the peak intensity of the laser light radiated from the first laser diode 42, and a second amplifier 49 for keeping constant the peak intensity of the laser light radiated from the second laser diode 42.

In this laser power control device 41, the first variable resistor 44 has one end grounded and the other end connected to the input terminal of the first amplifier 48. The second variable resistor 45 has one end connected to the junction of the first variable resistor 44 and the first amplifier 48, while the other end is connected to the input terminal of the second amplifier 49. The end connected to the input terminal of the second amplifier 49 is also connected to the anode of the photodiode 46; the cathode of which is grounded.

The first laser diode 42 has its cathode grounded and its anode connected to the collector of the PNP transistor 50.

The emitter of the PNP transistor 50 is connected through a resistor 51 to a power source 52. The emitter is fed with the voltage from the power source 52 through the resistor 51 when the first laser diode 42 is on. The base of the PNP transistor 50 is connected to the output terminal of the first amplifier 48. The laser power is controlled by the current flowing through the first laser diode 42 which, in turn, is regulated by transistor 50.

Similarly, the second laser diode 43 has its cathode grounded and its anode connected to the collector of a PNP transistor 53. The emitter of the PNP transistor 53 is connected through a resistor 54 to a power source 55. The emitter is fed with the voltage from the power source 55 through the resistor 54 when the second laser diode 43 is on. The base of the PNP transistor 53 is connected to the output terminal of the second amplifier 49. The laser power is controlled by the current flowing through the second laser diode 43 which is regulated by transistor 53.

To set the level of the laser power output by the first laser diode 42 to a predetermined level, the resistance of the first variable resistor 44 is varied. During subsequent operation, the laser light radiated from the first laser diode 42 is detected by the photodiode 46. The photodiode 46 generates a current proportional to the intensity of the detected light. This generated current is converted by the first amplifier 48 to a voltage potential which is applied to the base of PNP transistor 50. The PNP transistor 50 controls the drive current flowing to the laser diode in inverse proportion to the applied base voltage. For example, if photodiode 46 detects an increase in laser intensity, more current is produced which the amplifier uses to increase the base voltage which results in decreased laser drive current, thereby decreasing the laser intensity. In this manner, the photodiode 46 effectively regulates the drive current to keep the output laser intensity constant.

To set the power level of the laser light output by the second laser diode 43, the resistance of the second variable resistor 45 is varied and set so that the output will be at the predetermined level. During operation, the light intensity radiated from the second laser diode 43 is detected by the photodiode 46. The photodiode 46 generates a current proportional to the intensity of the detected light. This generated current is converted by the second amplifier 49 to a voltage potential which is applied to the base of PNP transistor 53. The PNP transistor 53 controls the drive current flowing to the laser diode in inverse proportion to the applied base voltage. For example, if photodiode 46 detects an increase in laser intensity, more current is produced which the amplifier uses to increase the base voltage which results in decreased laser drive current, thereby decreasing the laser intensity. In this manner, the photodiode 46 effectively regulates the drive current to keep the output laser intensity constant. Note that the resistance of the second variable resistor 45 is varied only after fixing the resistance of the first variable resistor 44.

With the above-described laser power control device 41, the power output by the two laser diodes 42, 43 can be separately controlled by a single circuit. It is therefore possible to reduce the size of the device, as compared to an arrangement providing independent laser power control devices for each laser diode. This also reduces the production cost by reducing the number of component parts.

If the first and second laser diodes 42, 43 are fabricated into a monolithic unit, the first and second laser diodes 42, 43 will be extremely close to each other. This makes it extremely difficult to provide individual light intensity detection means for each laser diode. In this laser power control device 41, detection of the light intensity output by the first laser diode 42 and the second laser diode 43 is handled by a single photodiode 46. This use of a single photodiode makes it possible to fabricate the first and second laser diodes 42, 43 monolithically into a single chip.

In the laser power control device 1, according to the first embodiment of the present invention, output control of the first laser diode 22 by the first variable resistor 24 and that of the second laser diode 23 by the second variable resistor 25 is carried out independently. In laser power control device 21, according to the second embodiment of the present invention, output control of the first laser diode 22 by the first variable resistor 24 and that of the second laser diode 23 by the second variable resistor 25 is also carried out independently. However, in laser power control device 41, according to the third embodiment of the present invention, output setting of the first laser diode 42 and that of the second laser diode 43 are not completely independent. The variable resistors 44, 45 are combined such that the output of the second laser diode 43 must be set after setting the output of the first laser diode 42. In this manner, the output of the first laser diode 22 and the output of the second laser diode 23 is controlled at the desired levels.

Figure 4:
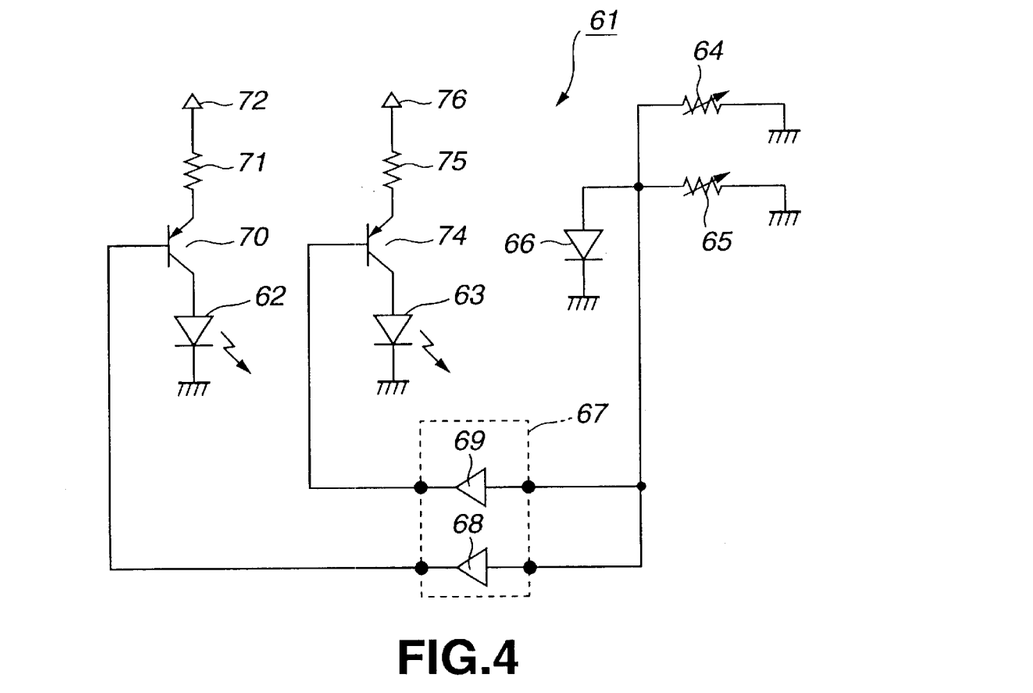
FIG. 4 is a circuit diagram showing yet another embodiment of a laser power control device according to the present invention.

A fourth embodiment of the laser power control device according to the present invention is hereinafter explained with reference to FIG. 4. This laser power control device 61 controls the laser light radiated from a first laser diode 62 as a first source and the laser light radiated from a second laser diode 63 as a second source. The first laser diode 62 and the second laser diode 63 are controlled to provide simultaneous operation.

This laser power control device 61 includes a first variable resistor 64 associated with the first laser diode 62, a second variable resistor 65 associated with the second laser diode 63, a power monitoring photodiode 66 associated with the first and second laser diodes 62, 63, and an automatic light volume controlling amplifier 67 for controlling the output of the laser light so that the output of the laser light radiated from the first and second laser diodes 62, 63 will be constant.

The automatic light volume controlling amplifier 67 is made up of a first amplifier 68 for keeping constant the peak intensity of the laser light radiated from the first laser diode 62, and a second amplifier 69 for keeping constant the peak intensity of the laser light radiated from the second laser diode 63.

In this laser power control device 61, the first variable resistor 64 has one end grounded and the other end connected to the input terminals of the first and second amplifiers 68, 69. Similarly, the second variable resistor 65 has one end grounded, while having its other end connected to the input terminals of the first and second amplifiers 68, 69. The terminals of the first and second variable resistors 64, 65 connected to the input terminals of the first and second amplifiers 68, 69 are also connected to the anode of the photodiode 66, the cathode of which is grounded.

The first laser diode 62 has its cathode grounded and its anode connected to the collector of a PNP transistor 70. The emitter of the PNP transistor 70 is connected through a resistor 71 to a power source 72. The emitter is fed with the voltage from the power source 72 through the resistor 71 when the first laser diode 62 is on. The base of the PNP transistor 70 is connected to the output terminal of the first amplifier 68. The laser output is controlled by the current flowing through the first laser diode 62 which, in turn, is regulated by transistor 70.

Similarly, the second laser diode 63 has its cathode grounded and its anode connected to the collector of a PNP transistor 74. The emitter of the PNP transistor 54 is connected through a resistor 75 to a power source 76. The emitter is fed with the voltage from the power source 76 through the resistor 75 when the second laser diode 63 is on. The base of the PNP transistor 74 is connected to the output terminal of the second amplifier 69. The laser output is controlled by the current flowing through the second laser diode 63 which is regulated by transistor 74.

To set the level of the laser power output by the first laser diode 62 to a predetermined level, the resistance of the first variable resistor 64 is varied. During subsequent operation, the laser light radiated from the first laser diode 62 is detected by the photodiode 66. The photodiode 66 generates a current proportional to the intensity of the detected light. This generated current is converted by the first amplifier 68 to a voltage potential which is applied to the base of PNP transistor 70. The PNP transistor 70 controls the drive current flowing to the laser diode in inverse proportion to the applied base voltage. For example, if photodiode 66 detects an increase in laser intensity, more current is produced which the amplifier uses to increase the base voltage which results in decreased laser drive current, thereby decreasing the laser intensity. In this manner, the photodiode 66 effectively regulates the drive current to keep the output laser intensity constant.

To set the power level of the laser light output by the second laser diode 63, the resistance of the second variable resistor 65 is varied and set so that the output will be at the predetermined level. During operation, the light intensity radiated from the second laser diode 63 is detected by the photodiode 66. The photodiode 66 generates a current proportional to the intensity of the detected light. This generated current is converted by the second amplifier 69 to a voltage potential which is applied to the base of PNP transistor 74. The PNP transistor 74 controls the drive current flowing to the laser diode in inverse proportion to the applied base voltage. For example, if photodiode 66 detects an increase in laser intensity, more current is produced which the amplifier uses to increase the base voltage which results in decreased laser drive current, thereby decreasing the laser intensity. In this manner, the photodiode 66 effectively regulates the drive current to keep the output laser intensity constant.

With the above-described laser power control device 61, the power output by the two laser diodes 62, 63 can be separately controlled by a single circuit. It is therefore possible to reduce the size of the device, as compared to an arrangement providing independent laser power control devices for each laser diode. This also reduces the production cost by reducing the number of component parts.

If the first and second laser diodes 62, 63 are fabricated into a monolithic unit, the first and second laser diodes 62, 63 will be extremely close to each other. This makes it extremely difficult to provide individual light intensity detection means for each laser diode. In this laser power control device 61 detection of the light intensity output by the first laser diode 62 and the second laser diode 63 is handled by a single photodiode 66. This use of a single photodiode makes it possible to fabricate the first and second laser diodes 62, 63 monolithically into single chip.

In laser power control device 61, according to the fourth embodiment of the present invention, the resistance values of the first variable resistor 64 and the second variable resistor 65 affect each other because the resistors are connected in parallel. Thus, if the resistance value of the first variable resistor 64 is varied to change the output setting of the first laser diode 62, the output setting of the second laser diode 63 is changed therewith. In a similar manner, if the resistance value of the second variable resistor 65 is varied to change the output setting of the second laser diode 63, the output setting of the first laser diode 62 is changed therewith. Thus, the output setting of the first laser diode 62 cannot be controlled independently of the second laser diode 63. Therefore, the resistance values of both the first and second variable resistors 64, 65 must be taken into account so that the output of the first laser diode 62 and that of the second laser diode 63 are at their desired levels.

Figure 5:
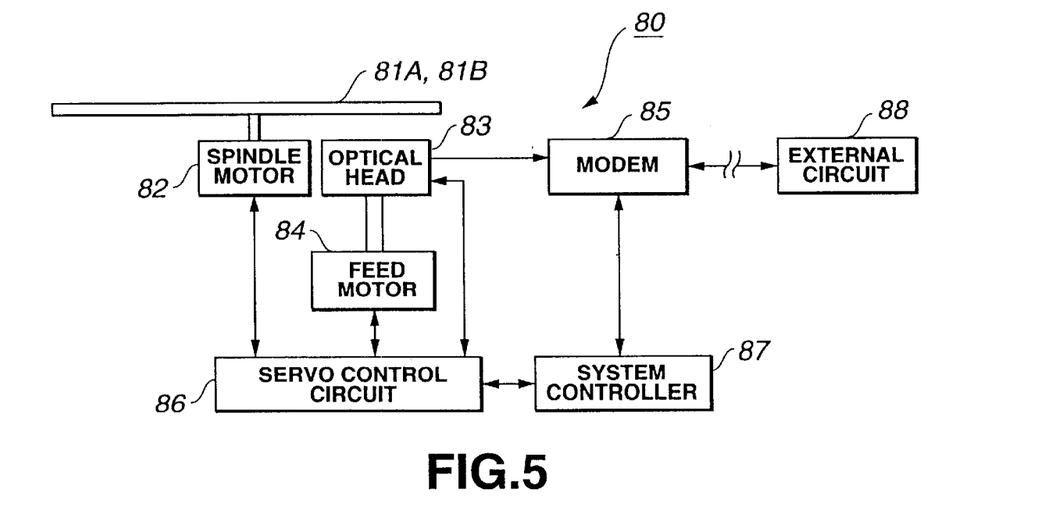
FIG. 5 is a block diagram showing an embodiment of an optical recording and/or reproducing apparatus according to the present invention.

An optical recording and/or reproducing apparatus 80, employing an optical head equipped with the above-described laser power control devices, is hereinafter explained. Referring to FIG. 5, optical recording and/or reproducing apparatus 80 includes a spindle motor 82 for rotationally driving optical discs 81A, 81B; an optical head 83 for illuminating the laser light on the optical discs 81A, 81B and for recording and/or reproducing the information; and a feed motor 84 for feeding the optical head 83 along the radius of the optical discs 81A, 81B. The optical recording and/or reproducing apparatus 80 also includes a modem 85 for performing predetermined modulation/demodulation operations, a driving control circuit 86 for servo controlling the optical head 83 and a system controller 87 for performing the overall system control.

This optical recording and/or reproducing apparatus 80 can use two types of optical discs for recording and/or reproduction. Each type of disk requires a different laser. The first optical disc 81A or the second optical disc 81B is selectively loaded on the spindle motor 82 and thereby rotated. As an example, the first optical disc 81A is able to record information at a higher density than the second optical disc 81B. This higher density information can be written or read out by illuminating laser light on the information recording surface through a transparent substrate having a plate thickness on the order of about 1.2 mm.

The spindle motor 82 is driven by a driving control circuit 86 and is rotated at a predetermined speed. That is, the optical disc 81A, 81B, as recording mediums, are chucked by the spindle motor 82, and rotated at a predetermined speed by the spindle motor 82 driven by the driving control circuit 86.

When recording and/or reproducing the information signals, the optical head 83 illuminates the laser light on the rotating optical disc 81A, 81B and detects the return light reflected back. The optical head 83 has two laser diodes, each having different oscillation wavelengths, and is configured to handle both types of optical disc. The optical head 83 is connected to the modem circuit. When reproducing information signals, the laser light is illuminated on the rotating optical disc 81A, 81B and the playback signals are read out from the return light reflected back from the optical disc. The playback signals, thus read out, are routed to the modem 85. When recording information signals, the recording signals, input from an external circuit 88 are modulated in a pre-set manner by the modem 85, and routed to the optical head 83, which then records the information signals by modulating the laser light radiating the optical disc 81A or 81B.

The optical head 83 is connected to the driving control circuit 86. Focussing error signals and tracking error signals are generated from the return light reflected back from the rotating optical disc 81A, 81B during recording and/or reproduction of the information signals. These error signals are then routed to the driving control circuit 86.

The modem 85 is connected to system controller 87 and to external circuit 88. When recording information signals on the optical disc 81A, 81B, the modem 85 is controlled by the system controller 87, such that recording signals are sent thereto from the external circuit 88. The supplied signals are modulated and then routed to the optical head 83. The modem 85 is also controlled by the system controller 87 such that the playback signals read out from the optical disc 81A, 81B are routed from the optical head 83 to the modem 85 which then demodulates the read-out signals. The playback signals, demodulated by the modem 85, are then output from the modem 85 to the external circuit 88.

The feed motor 84 is configured to position the optical head 83 at a pre-set position with respect to the optical disc 81A, 81B. This feed motor 84 is connected to the driving control circuit 86 and has its driving operation controlled by the driving control circuit. The driving control circuit 86 is also connected to the spindle motor 82 and is controlled by the system controller 87. Thus, the driving control circuit 86 controls the driving of the spindle motor 82 during recording and/or reproduction of information signals, so that the optical disc 81A, 81B will be rotated at a predetermined speed.

The driving control circuit 86 is also connected to the optical head 83. During recording and/or reproduction of information signals, the driving control circuit 86 is supplied with the focussing error signals and tracking error signals, to perform focussing servo and tracking servo operations for the optical head 83. The focussing servo and tracking servo operations are effectuated by driving a biaxial actuator, adapted for driving and displacing an objective lens provided on the optical head 83.

Figure 6:
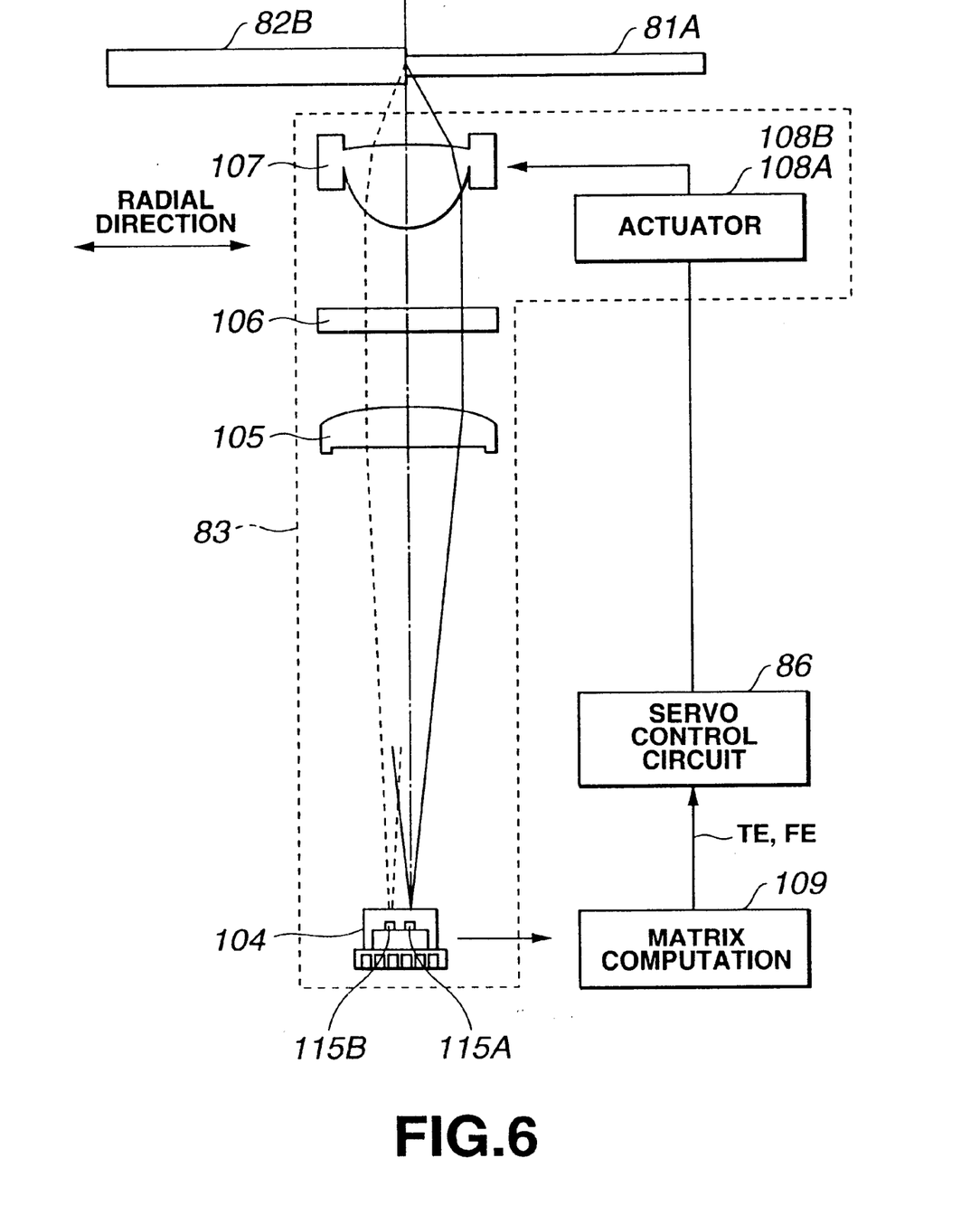
FIG. 6 is a side view showing an embodiment of an optical head according to the present invention.
Figure 7A:
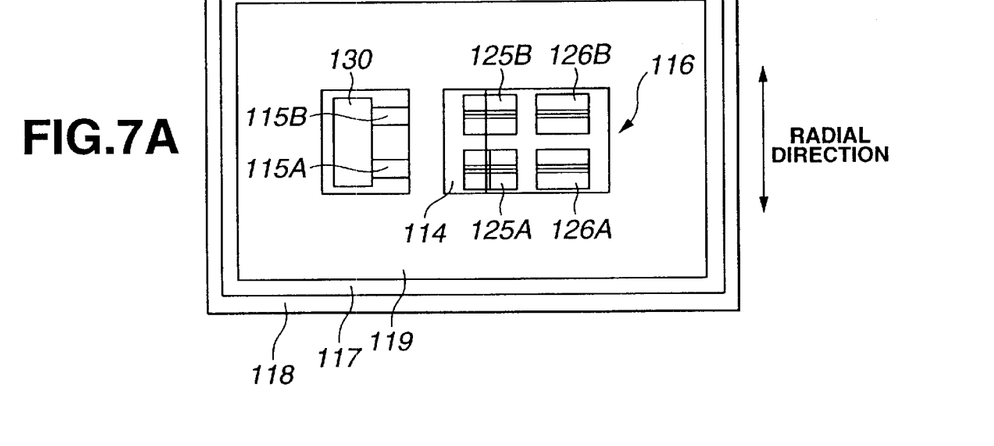
FIG. 7 is a plan view showing an optical integrated device constituting the optical head according to the present invention.
Figure 7B:
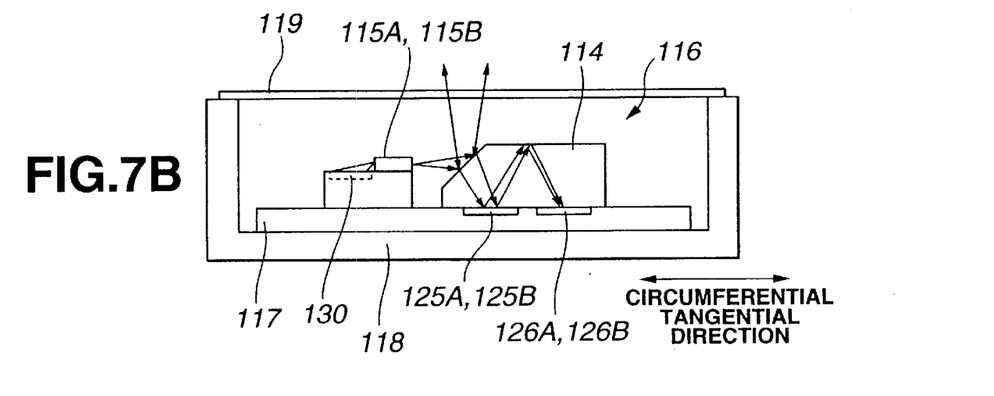
Figure 8:
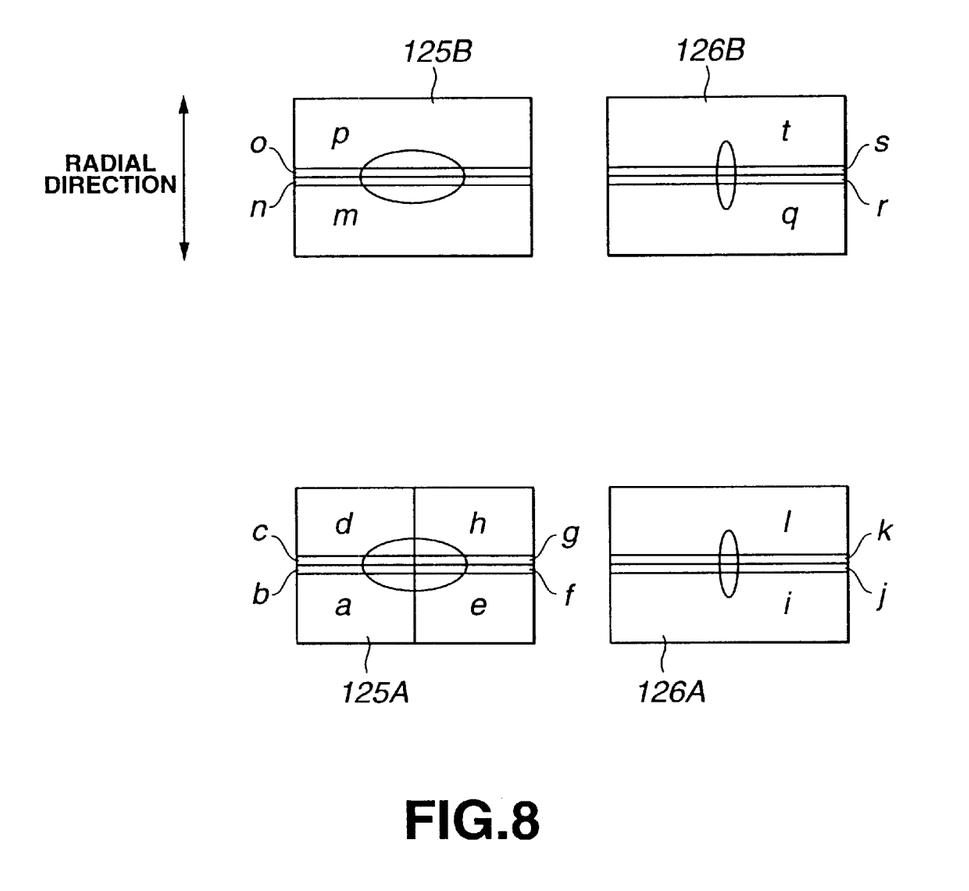
FIG. 8 is a plan view showing a light receiving surface of the optical integrated device shown in FIG. 7.

The above-described optical recording and/or reproducing apparatus employs the optical head 83 as shown in FIGS. 6–8. This optical head 83 allows the use of two different types of optical discs. These optical discs are the first and second optical discs 81A, 81B. The manner in which these first and second optical discs 81A, 81B are selectively used to effect recording and/or reproduction of information signals is shown in FIG. 6.

The optical head 83 according to the present invention is configured so that the laser light radiated from a laser light source included in an optical integrated device 104 is transmitted through a collimator lens 105, an aperture 106, and an objective lens 107 to the optical disc 81A or 81B. The return light reflected back from the optical disc 81A or 81B is then incident on the optical integrated device 104 through the collimator lens 105, aperture 106, and the objective lens 107.

The optical integrated device 104 includes a photodetector for signal detection of the laser source for the first optical disc, a photodetector for signal detection of the laser source for the second optical disc, and a photodetector for power monitoring. These elements are integrated into a single package, in a manner which will be subsequently explained. In the optical integrated device 104, the semiconductor laser diodes making up the respective laser sources are arranged at a spacing on the order of approximately 100 microns along the radius of the optical disc 81A or 81B. These two semiconductor laser diodes are independently operated, under control by the system controller 87, for each of the optical disc 81A and 81B. By driving the two semiconductor laser diodes independently, the optical integrated device 104 selectively radiates the laser light of a wavelength associated with the optical disc 81A or 81B and detects the return light by a signal detection photodetector associated with that disc. The laser light radiated from each semiconductor laser diode falls on the power monitoring photodetector which enables the laser power control device to control the laser power.

The collimator lens 105 converts the laser light radiated from the optical integrated device 104 into a collimated beam. The collimator lens 105 is arranged with respect to the optical integrated device 104 so that the optical axis of the collimator lens coincides with the optical axis of the laser light for the first optical disc 81A but is offset with respect to the optical axis of the laser light for the second optical disc 81B.

The aperture 106 is a circular opening formed in a transparent plate member having a dielectric film which acts as a wavelength filter. The aperture 106, operating as a filter, is adapted to block the 780 nm laser wavelength for the second optical disc 81B and to transmit the 650 nm laser wavelength for the first optical disc 81A. The aperture 106, thus configured, operates to trim the beam shape of the 780 nm laser wavelength to a beam diameter determined by the size of the opening. Thus, 780 nm laser light is propagated with the trimmed beam shape, while the 650 nm laser light for the first optical disc 81A is propagated without the beam shape changed.

The objective lens 107 is a non-spherical lens formed, for example, by injection molding of a transparent synthetic resin. By judiciously selecting the refractive index of the styrene resin constituting the lens, and the shape of the lens surfaces, the objective lens 107 collects the light of the first and second wavelengths, which are incident thereon as substantially collimated light beams. The light is then propagated onto the signal recording surfaces of the associated optical disc 81A or 81B. That is, the objective lens 107 constitutes a bi-focal lens associated with the first and second optical disc 81A, 81B.

The objective lens 107 is supported by a tracking controlling actuator 108A for movement along the radius of the first and second optical discs 81A, 81B. Tracking control occurs such that, as the tracking controlling actuator 108A is driven responsive to the tracking error signals TE, the laser light will scan a predetermined track of the optical disc 81A or 81B. The objective lens 107 is also supported by a focussing control actuator 108B for movement along the optical axis of the lasers. Focussing control occurs such that, as focussing control actuator 108B is driven responsive to the focussing error signals FE, the laser light will be focussed on the signal recording surfaces of the optical disc 81A or 81B.

The optical head 83 is provided with a matrix processing circuit 109 to perform matrix processing on the reflected light received by the signal detecting photodetector of the optical integrated device 104. This circuit generates the tracking error signals TE in response to changes in the amount of the tracking error, the focussing error FE in response to changes in the amount of the focussing error and the playback signals in response to changes in recording indicia (for example, the pit string) on the discs. The matrix processing circuit 109 generates the tracking error signals independently for each disc type.

Referring to FIGS. 7A and 7B, more details of the optical integrated device 104 will be explained. This optical integrated device 104 is made up of a semiconductor substrate 117 with an optical system 116 formed thereon. The semiconductor substrate 117 carries thereon signal detecting photodetectors 125A, 125B, 126A, and 126B. The optical system 116 includes a prism 114, first and second semiconductor laser diodes 115A, 115B, and a power monitoring photodetector 130 for controlling the laser power of the semiconductor laser diodes 115A, 115B. The optical system 116 is housed and wired in a package 118 and is sealed with a glass lid 119 as a transparent sealing member.

The first semiconductor laser diode 115A and the second semiconductor laser diode 115B are spaced approximately 100 microns from each other along the radius of the optical disc 81A, 81B. The laser light from both the first and second diodes is radiated towards the prism 114. Although the first and second semiconductor laser diodes 115A, 115B are separately shown as two light radiating sources of different wavelengths, it is also possible to integrate two light emitting points into one chip as a one-chip two-wavelength sending laser unit.

The power monitoring photodetector 130 is on the opposite side of the prism 114 from the first and second semiconductor laser diodes 115A, 115B. Thus, the photodiode receives the laser light radiated from the back sides of the first and second semiconductor laser diodes 115A, 115B. Based on the results of detection of the laser light received by this power monitoring photodetector 130, the first and second semiconductor laser diodes 115A, 115B are set to respective predetermined power levels by the laser power control devices shown in the first to fourth embodiments described above. After setting the predetermined power level, the output is controlled so that the laser power level will be constant.

In the present embodiment, in which the first and second semiconductor laser diodes 115A, 115B are arranged in proximity to one other, it is advantageous to use a single photodetector as the power monitoring photodetector 130 for both diodes.

The prism 114 is an optical component for separating the laser light incident on the optical disc 81A, 81B, and is configured substantially as a parallelepiped having an oblique surface on its one lateral side. This prism 114 reflects the laser light, off its inclined surface, towards the collimator lens 105. The return light from the disc is propagated along a reverse optical path and returns incident to the oblique surface and passes into the prism. It is noted that the return light falls on a specific location on the lower prism surface (referred to below as the front side), through which approximately 50% of the incident light is transmitted, with the remaining 50% being reflected back towards the upper prism surface. To this end, the prism 114 has a vapor deposited mirror surface on its upper surface. Thus, the reflected light is again reflected, this time off the mirrored upper surface, back towards the lower surface. This twice reflected light is then incident at a different location on the lower surface (referred to below as the rear side) and is transmitted through the surface. These surfaces ensure that the intensity of the light first transmitted through the lower prism surface is approximately equal to the intensity of the twice reflected light transmitted through the lower prism surface.

On those portions of the semiconductor substrate 117, where the light of the first laser and the light of the second laser returned from the disc fall, there are formed the signal detection photodetectors 125A, 126A for the first optical disc 81A and signal detection photodetectors 125B, 126B for the second optical disc 81B, respectively. The photodetectors 126A, 126B are arranged toward the rear side. FIG. 8, shows an enlargement of these photodetectors. The orientation of the semiconductor laser diodes 115A and 115B and the size of the prism 114 are selected such that the beam spot shape formed on the semiconductor substrate 117 by the light returned from the disc and transmitted through the prism 114 will be substantially in the form of a focal line and an ellipsis (having a long axis in a direction perpendicular to the direction of extension of the focal line of the rear side), on the rear side and on the front side, respectively.

The photodetectors 125B, 126B for the second optical disc 81B, substantially rectangular in profile, are arranged side-by-side along the circumferential and tangential direction of the second optical disc 81B. They are separated from each other along the radial direction of the second optical disc 81B, by a division line extending in the circumferential tangential direction. The beam spot formed on each light receiving surface is split into four segments along the radius of the second optical disc 81B. The outer front side light receiving surfaces are denoted by reference elements m and p. The inner front side light receiving surfaces are denoted by reference elements n and o. The outer rear side light receiving surfaces are denoted by reference elements q and t. The inner rear side light receiving surfaces are denoted by reference elements r and s.

The photodetectors 125A, 126A for the first optical disc are also substantially rectangular in profile, and are arranged side-by-side along the circumferential and tangential direction of the first optical disc 81A. The rear side photodetector 126A is configured similarly to the rear side photodetector 126B of the second optical disc 81B. However, the front side photodetector 125A has the light receiving surface split into two segments along the circumferential tangential direction of the optical disc, but is otherwise similar in structure to the front side photodetector 125B of the second optical disc 81B. The outer side and the oblique surface side towards the front side of the smal[008c] 5 sized light receiving surface for the front side photodetector 125A are denoted by reference elements a and d. The inner side and the oblique surface side towards the front side are denoted by reference elements b and c. The outer side and the side remote from the oblique surface towards the front side are denoted by reference elements c and h. The inner side and the side remote from the oblique surface towards the front side are denoted by reference elements f and g. The outer sides towards the rear side are denoted by reference elements i and l. The inner sides towards the rear side are denoted by reference elements j and k.

These various light receiving surfaces, denoted as reference elements a-t, each measure the intensity of a different segment/component of the beam spots returned from the optical disc 81A or 81B. The semiconductor substrate 117 processes the light received by these light receiving surfaces by current-to-voltage conversion and arithmetic operations to output the resulting signals. The matrix processing circuit 109 processes these output signals to generate tracking error signals and focussing error signals as described hereinafter.

For optical disc 81A, the focus error signal FEA is generated by the D-3DF (Differential-3 Divided Focusing) method, the tracking error signal $TE_A$ is generated by the DPD (differential phase detection) method, and the read signal $RF_A$ is a summation of surfaces a through l, as shown in Equations 1–3, respectively. In these equations, the symbols a through I represent the current generated as a result of light detected by elements a through l, respectively.

$FE_A = (a+e+d+h+j+k)-(b+f+c+g+i+l)$  Equation 1

$TE_A = (a+b+g+h)-(c+d+e+f)$  Equation 2

$RF_A = (a+b+c+d+e+f+g+h+i+j+k+l)$  Equation 3

For optical disc 81B, the focus error signal FEB is generated by the D-3DF method, the tracking error signal TE$_B$ is generated by the Push-Pull method, and the read signal RF$_B$ is a summation of surfaces m through t, as shown in Equations 4–6, respectively. In these equations, the symbols m through t represent the current generated as a result of light detected by elements m through t, respectively.

$$FE_B=(m+p+r+s)-(n+o+q+t) \quad \text{Equation 4}$$

$$TE_B=(m+n+s+t)-(o+p+q+r) \quad \text{Equation 5}$$

$$RF_B=(m+n+o+p+q+r+s+t) \quad \text{Equation 6}$$

The optical integrated device 104 can be packaged into a compact size with high positioning accuracy by arranging the respective components, such as prism 114, first and second semiconductor laser diodes 115A, 115B and the power monitoring photodetector 130 on the semiconductor substrate 117. The laser power control device of the present invention can be effectively exploited by properly arranging the power monitoring photodetector 130 with respect to the two laser diodes 115A, 115B.

The optical recording and/or reproducing apparatus 80, including the optical head 83 according to the present invention, has two laser diodes having different oscillation wavelengths. This allows it to operate with two types of optical discs requiring different wavelengths of laser light. That is, the present invention not only enables selective recording and/or reproduction of information signals for two types of optical discs, but also is effective in employing different wavelength laser light beams for performing different recording and reproduction operations for a single type of optical disc.

With the present invention, in which the output of the two laser diodes loaded on the optical head 83 are controlled by a laser power control device, the laser light power output by plural laser diodes can be respectively controlled by a single circuit. Thus, with the optical recording and/or reproducing apparatus 80 of the present invention, the entire system can be packaged smaller than if separate laser power control devices were provided for each laser diode. Additionally, the number of component parts can be reduced, thereby reducing the production cost. Therefore, according to the present invention, in which plural laser sources can be controlled by a single laser power control device, a system using this device reduces the size, number of components, and production costs over prior art systems.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a sense.

What is claimed is:

1. A laser power control device for controlling the output of respective laser beams radiated from a plurality of laser sources, comprising:
    a plurality of variable resistors corresponding to said plurality of laser sources; the resistance value of each of said variable resistors being changeable to set the output power of the laser beam radiated from the corresponding laser source at a predetermined level;
    a single photodetector for detecting the output power of the laser beams radiated from said plurality of laser sources; and
    an output stabilizer for maintaining constant the output power of the laser beams radiated from the laser sources at said predetermined levels on the basis of the detected output power.

2. The laser power control device according to claim 1, further comprising a plurality of switches respectively connected to said plurality of variable resistors; the switches being configured in setting the output power of the laser beams so that only the variable resistor corresponding to the laser source being set is operably connected to the laser diode, while the remaining variable resistors are floating.

3. The laser power control device according to claim 2, wherein said plurality of switches are further configured when controlling the output power of the laser beams so that only the variable resistor corresponding to the laser source being controlled is operably connected to the laser diode, while the remaining variable resistors are floating.

4. The laser power control device according to claim 1, wherein said plurality of variable resistors are connected in parallel with said photodetector.

5. The laser power control device according to claim 1, wherein said plurality of variable resistors are connected in series with said photodetector.

6. The laser power control device according to claim 1, wherein said output stabilizer includes control amplifiers corresponding to said laser sources.

7. An optical head comprising:
    a plurality of laser sources;
    an optical unit for propagating laser beams radiated from said plurality of laser sources towards a recording medium;
    a light receiver for receiving return light reflected from said recording medium;
    a power controller for controlling the output of the laser beams radiated from said plurality of laser sources; said power controller including a plurality of variable resistors corresponding to said plurality of laser light sources; the resistance value of each of said variable resistors being changeable to set the output power of the laser beam radiated from the corresponding laser source at a predetermined level;
    a photodetector for detecting the output power of the laser beams radiated from said plurality of laser sources; and
    an output stabilizer for maintaining constant the output power of the laser beams radiated from the laser sources at said predetermined levels on the basis of the detected output power.

8. The optical head according to claim 7, further comprising a plurality of switches respectively connected to said plurality of variable resistors; the switches being configured in setting the output power of the laser beams so that only the variable resistor corresponding to the laser source being set is operably connected to the laser diode, while the remaining variable resistors are floating.

9. The optical head according to claim 8, wherein said plurality of switches are further configured when controlling the output power of the laser beams so that only the variable resistor corresponding to the laser source being controlled is operably connected to the laser diode, while the remaining variable resistors are floating.

10. The optical head according to claim 7, wherein said plurality of variable resistors are connected in parallel with said photodetector.

11. The optical head according to claim 7, wherein said plurality of variable resistors are connected in series with said photodetector.

12. The optical head according to claim 7, wherein said output stabilizer includes control amplifiers corresponding to said laser sources.

13. The optical head according to claim 7, wherein each of said plurality of laser sources radiates a different wavelength laser beam.

14. The optical head according to claim 7, wherein said plurality of laser sources are arranged in close proximity to one another.

15. The optical head according to claim 7, wherein said plurality of laser sources, said light receiver, and said photodetector are integrated on a single substrate.

16. The optical head according to claim 15, wherein said photodetector and said plurality of laser sources are located on respectively opposite sides of said light receiver.

17. An optical recording and/or reproducing apparatus for recording information to and/or reproducing information from an optical recording medium comprising:
   a plurality of laser sources;
   an optical unit for propagating laser beams radiated from said plurality of laser sources towards said recording medium;
   a light receiver for receiving the return light reflected from said optical recording medium;
   a driver for rotatably driving said optical recording medium; and
   a laser power control device for controlling the outputs of the respective laser beams emitted from said plurality of laser sources, including:
      a plurality of variable resistors corresponding to said plurality of laser sources; the resistance value of each of said variable resistors being changeable to set the output power of the laser beam radiated from the corresponding laser source at a predetermined level;
      a photodetector for detecting the output power of the laser beams radiated from said plurality of laser sources; and
      an output stabilizer for maintaining constant the output power of the laser beams radiated from the laser sources at said predetermined levels on the basis of the detected output power.

18. The optical recording and/or reproducing apparatus according to claim 17, further comprising a plurality of switches respectively connected to said plurality of variable resistors; the switches being configured in setting the output power of the laser beams so that only the variable resistor corresponding to the laser source being set is operably connected to the laser diode, while the remaining variable resistors are floating.

19. The optical recording and/or reproducing apparatus according to claim 18, wherein said plurality of are further configured when controlling the output power of the laser beams so that only the variable resistor corresponding to the laser source being controlled is operably connected to the laser diode, while the remaining variable resistors are floating.

20. The optical recording and/or reproducing apparatus according to claim 17, wherein said plurality of variable resistors are connected in parallel with said photodetector.

21. The optical recording and/or reproducing apparatus according to claim 17, wherein said plurality of variable resistors are connected in series with said photodetector.

22. The optical recording and/or reproducing apparatus according to claim 17, wherein said output stabilizer includes control amplifiers corresponding to said laser light sources.

23. The optical recording and/or reproducing apparatus according to claim 17, wherein each of said plurality of laser sources radiates a different wavelength laser beam.

* * * * *